United States Patent
Lindemann et al.

(10) Patent No.: US 8,803,717 B2
(45) Date of Patent: Aug. 12, 2014

(54) DELTA SIGMA MODULATOR

(75) Inventors: Stig Alnøe Lindemann, Aarhus N (DK); Mads Kolding Nielsen, Hovedgård (DK)

(73) Assignee: PR Electronics A/S, Rønde (DE)

( * ) Notice: Subject to any disclaimer, the term of this patent is extended or adjusted under 35 U.S.C. 154(b) by 0 days.

(21) Appl. No.: 13/642,870

(22) PCT Filed: Apr. 18, 2011

(86) PCT No.: PCT/DK2011/050124
§ 371 (c)(1),
(2), (4) Date: Dec. 11, 2012

(87) PCT Pub. No.: WO2011/131202
PCT Pub. Date: Oct. 27, 2011

(65) Prior Publication Data
US 2013/0076548 A1 Mar. 28, 2013

(30) Foreign Application Priority Data
Apr. 23, 2010 (DK) ................................ 2010 00359

(51) Int. Cl.
*H03M 3/00* (2006.01)

(52) U.S. Cl.
USPC ............................................ 341/143; 341/155

(58) Field of Classification Search
USPC ............................................ 341/143, 144, 155
See application file for complete search history.

(56) References Cited

U.S. PATENT DOCUMENTS

| | | | |
|---|---|---|---|
| 6,480,129 B1 | 11/2002 | Melanson | |
| 7,212,142 B2 * | 5/2007 | Brooks | ............ 341/143 |
| 7,253,757 B2 * | 8/2007 | Koch | ............ 341/143 |
| 7,924,194 B2 * | 4/2011 | Kumar | ............ 341/143 |
| 8,482,443 B2 * | 7/2013 | Kim et al. | ............ 341/143 |

FOREIGN PATENT DOCUMENTS

| | | |
|---|---|---|
| AU | 2003304049 | 11/2004 |
| JP | 7321661 | 12/1995 |
| JP | 11041106 | 2/1999 |

* cited by examiner

*Primary Examiner* — Brian Young
(74) *Attorney, Agent, or Firm* — James Creighton Wray

(57) ABSTRACT

A modulation system and method for a converter system, preferable a Delta Sigma converter, is described. The system is operable to adjust the modulation performed depending on the specified format of the input and output signals for the converter. The feedback and feed forward pulsed may be adjusted depending on the requirements of the converter.

20 Claims, 5 Drawing Sheets

DELTA SIGMA MODULATOR

This application claims the benefit of Danish Application No. PA 2010 00359 filed Apr. 23, 2010 and PCT/DK2011/050124 filed Apr. 18, 2011, International Publication Number WO 2011/131202.

FIELD OF THE INVENTION

The present invention relates to a modulation method and associated modulator system for a delta sigma converter.

BACKGROUND OF THE INVENTION

Delta Sigma (or Sigma Delta) converters are a well-known type of converter circuit providing a high resolution output with a low implementation cost.

An example of a known $2^{nd}$ order Delta Sigma converter is illustrated in FIG. 1. An analogue input signal 10 is received, and a feedback error signal subtracted 12 from the input. The resulting difference value is integrated (or summed) in first integrator 14. The error signal is then subtracted 16 from the output of the first integrator 14, with the resulting difference being the input for a second integrator 18. The output of the second integrator 18 is sent to a comparator 20 which is operable to output a HIGH or LOW value, depending on the value of the input signal. The comparator 20 output is coupled to the input of a latch 22 driven by a system clock 24. The latch 22 outputs a single bit stream which is the output 26 of the Delta Sigma converter, and which may be used by appropriate output hardware (not shown) to produce an output value in the appropriate range required. The single bit stream is also used as the input to a 1 bit DAC 28, the output of which is used as the feedback signal for the two subtraction operations 12 and 16.

A corresponding feedback signal for an arbitrary input signal is shown in FIG. 2. It can be seen that the feedback signal output by the DAC 28 follows the clock 24 in timing and pulse width.

It is an object of the invention to provide a Delta Sigma system having improved noise characteristics, performance, and flexibility of implementation

SUMMARY OF THE INVENTION

Accordingly, there is provided a modulation method for a converter having an input circuit to receive an input signal and an output circuit to provide a converted output signal, the modulation method comprising the steps of:
  receiving a comparator output from an input circuit;
  sampling said comparator output based on a first clock;
  generating a forward pulse to an output circuit based on said first clock;
  generating a feedback signal for said input circuit based on a second clock,
  wherein said second clock has a lesser frequency than said first clock.

Preferably, the method comprises the step of delaying said feedback signal is delayed relative to the sampling Preferably, the method comprises the step of sending said forward pulse to said output circuit when the sampled comparator output is High.

Preferably, said step of generating a forward pulse is based on at least one system constant, and wherein said system constant is dependent on the characteristics of at least one of the input signal of said input circuit or the output signal of said output circuit.

Preferably, the method comprises the step of detecting the characteristics of said input signal of said input circuit and said output signal of said output circuit.

There is also provided a modulation method for a Delta Sigma converter, the Delta Sigma converter comprising an input circuit operable to receive an input signal and provide an integrated input signal having a negative feedback loop, and an output circuit operable to receive a modulated output signal and produce a converted output signal, wherein the method comprises the steps of:
  providing a comparator output of an integrated input signal of said input hardware circuit;
  sampling said comparator output, said sampling based on a first clock frequency;
  performing a forward conditioning operation on said sampled comparator output to provide a modulated output signal for said output circuit;
  generating a modulated feedback signal based on said sampled comparator output, said generating based on a second clock frequency; and
  outputting said modulated feedback signal to said input circuit, wherein said first clock frequency is less than said second clock frequency.

As the feedback system is operating on a faster clock than the sampling system, the feedback signal does not have the same pulse width as the sampled comparator output. As a result, the system performs a part of an $A*x+B$ linear conversion by having the feedback different from 1 (normally the time of the feedback is the same as the time for the sample. In a preferred embodiment, the difference is approximately $14/63$.

Preferably, the input circuit and the output circuit are operable to provide different combinations of input signal and converted output signal formats, wherein the method comprises the step of detecting the input-output format combination of the input circuit and the output circuit, and wherein said step of performing a forward conditioning operation is based on said detected input-output format combination.

The input and output hardware can be configured to switch between different configurations of input signal and output signal, e.g. having different voltage spans, different reference voltages used, whether the input or output is a current signal or a voltage signal, etc. Accordingly, the system can detect which particular combination is currently selected, and can adjust the modulation technique accordingly.

Preferably, said step of performing a forward conditioning operation comprises performing a mathematical operation on said sampled comparator output, said mathematical operation based on a set of constants, wherein the method comprises the steps of:
  storing a plurality of constants in memory;
  detecting the input-output format combination of the input circuit and the output circuit; and
  selecting a set of constants from memory from said plurality of constants based on said detected input-output format combination;
  performing said mathematical operation using said selected set of constants.

As the forward conditioning can be characterised using a set of constants, wherein said constants are dependent on the desired input/output characteristics of the delta sigma converter, the system can be dynamically adjusted based on the selected input/output combination. To do this, a series of constants can be pre-defined and stored in memory at the converter, and accessed when required (i.e. when the input/output setup of the converter is changed).

Preferably, said step of performing a forward conditioning operation comprises the steps of:
adding a constant in an accumulator, wherein said constant value is selected based on the sampled comparator output; and
generating a modulated output signal based on the output of said accumulator.

Preferably, said step of performing a forward conditioning operation comprises the steps of:
if said sampled comparator output is High,
adding a first selected constant K1 in the accumulator, and
sending a modulated output signal to said output circuit, said modulated output signal based on the output of said accumulator; and
if said sampled comparator output is Low,
adding a second selected constant K2 in the accumulator.

The comparator output will be either a High or Low value, i.e. a logical '1' or a logical '0'. This acts to determine if a forward pulse should be sent from the modulation section to the output circuit for conversion to an appropriate output signal. It also determines the operation to be performed by the forward conditioning circuit. It should be noted that the integer part of the accumulated value can be cleared when a forward pulse is generated.

Preferably, the method comprises the step of clearing the integer section of the accumulator when a modulated output signal is generated.

Preferably, the method comprises the step of providing said first selected constant K1 and said second selected constant K2, and wherein K1 and K2 are defined by the formulas:

$$K1 = \frac{\text{Dig\_Per}}{\text{VrefOut}} \cdot \left( Vout_{0\%} \cdot \frac{1-m_2}{m_1 - m_2} - Vout_{100\%} \cdot \frac{1-m_1}{m_1 - m_2} \right)$$

$$K2 = \frac{\text{Dig\_Per}}{\text{VrefOut}} \cdot \left( Vout_{100\%} \cdot \frac{m_1}{m_1 - m_2} - Vout_{0\%} \cdot \frac{m_2}{m_1 - m_2} \right)$$

$$m_1 = \frac{Vin_{0\%}}{\text{VrefIn}} \cdot \frac{\text{Dig\_Per}}{\text{Dig\_FB}}$$

$$m_2 = \frac{Vin_{100\%}}{\text{VrefIn}} \cdot \frac{\text{Dig\_Per}}{\text{Dig\_FB}}$$

where Dig_Per is the period of said first clock frequency, Dig_FB is the duration of one period of the modulated feedback signal, Vin0% is the input low voltage, Vin100% is the input high voltage, Vout0% is the output low voltage, Vout100% is the output high voltage, VrefIn is the input reference voltage, and VrefOut is the output reference voltage.

The use of such constants results in a system transfer function for the Delta Sigma converter of:

$$V_{Out} = V_{In} \cdot (k_1 - k_2) + V_{ref} \cdot k_2 = V_{In} \cdot \alpha + \beta$$

This may be easily modelled and simulated as required.

Preferably, the method comprises the step of storing constants K1 and K2 as two's complement binary numbers, and wherein said adding steps comprise a two's complement binary addition.

Storing the constants as two's complement binary allows for a combination of precision, simple computational implementation, and efficiency of storage.

Preferably, said step of sending a modulated output signal to said output circuit comprises sending the integer result of the adding operation as the modulated output signal.

Preferably, said constants K1 and K2 are defined as 24 bit values, wherein 8 bits comprise the integer value of the constants, wherein said step of adding comprises a 24 bit accumulation operation, and wherein said step of sending a modulated output signal to said output circuit comprises sending the 8 bits representing an integer value of the 24 bit accumulation as the modulated output signal.

As the two's complement format allows for easy addition of the constants in an accumulator, the system can be easily implemented in basic hardware, such as a simple microprocessor. Preferably, the 8 bits are selected as the Most Significant Byte of the 24 bit values.

Preferably, the method comprises the steps of:
providing a first clock having a first clock frequency; and
providing a system clock having a second clock frequency, wherein said first clock is provided by downsampling said system clock.

Downsampling the system clock provides for a simple method of producing a clock having a lower frequency than the system clock. The downsampling is based on a set constant Dig_Per, which is the desired period of the first clock frequency.

Preferably, said step of generating a modulated feedback signal comprises the steps of:
counting the pulses of said system clock to provide a count value CNT; and
when CNT is less than a predefined period value Dig_FB, outputting said sampled comparator output as said modulated feedback signal;
when CNT is greater than or equal to said predefined period value Dig_FB, outputting 0 as said modulated feedback signal.

This allows for a predefined length of the feedback pulse—Dig_FB—in terms of pulses of the system clock. Accordingly, the feedback signal does not have the same pulse width as the bits provided in the single bit stream of the sampled comparator output.

Preferably, said step of generating a modulated feedback signal comprises the step of:
initialising said CNT value for every pulse of said first clock.

This allows for the counter to be reset with every pulse of the first clock.

Preferably, said step of generating a modulated feedback signal comprises performing a digital to analogue signal conversion of said modulated feedback signal.

Preferably, said step of providing a comparator output comprises the step of comparing an integrated output of said input hardware circuit with a threshold value.

There is also provided a signal converter comprising:
an input circuit operable to receive an input signal and provide an integrated input signal having a negative feedback loop;
an output circuit operable to receive a modulated output signal and produce a converted output signal; and
a controller operable to receive said integrated input signal and output a modulated feedback signal to said input circuit and a modulated output signal to said output circuit, wherein the controller is operable to implement any of the method steps as described above.

Preferably, the converter is a Delta Sigma converter. Preferably, the converter is operable to convert an input voltage or current signal into an output voltage or current signal.

There is also provided a method for converting analogue values into voltage values by performing at least the following steps by a digital processor:
  a: perform a selection between current and voltage analogue input values,
  b: perform a selection between current and voltage analogue output values,
  c: perform a galvanic isolation between the input and the output,
  d: perform an analogue digital conversion of the input current values,
  e: the input conversion is performed by a second order sigma delta converter, feedback pulses for the sigma delta converter is generated by a CCP register in the digital processor,
  f: transmit the digital input values to at least one opto coupler, and
  g: perform a digital to analogue conversion of the digital signal generated at the output of the opto coupler.

DESCRIPTION OF THE INVENTION

Embodiments of the invention will now be described, by way of example only, with reference to the accompanying drawings, in which.

Figure 3:
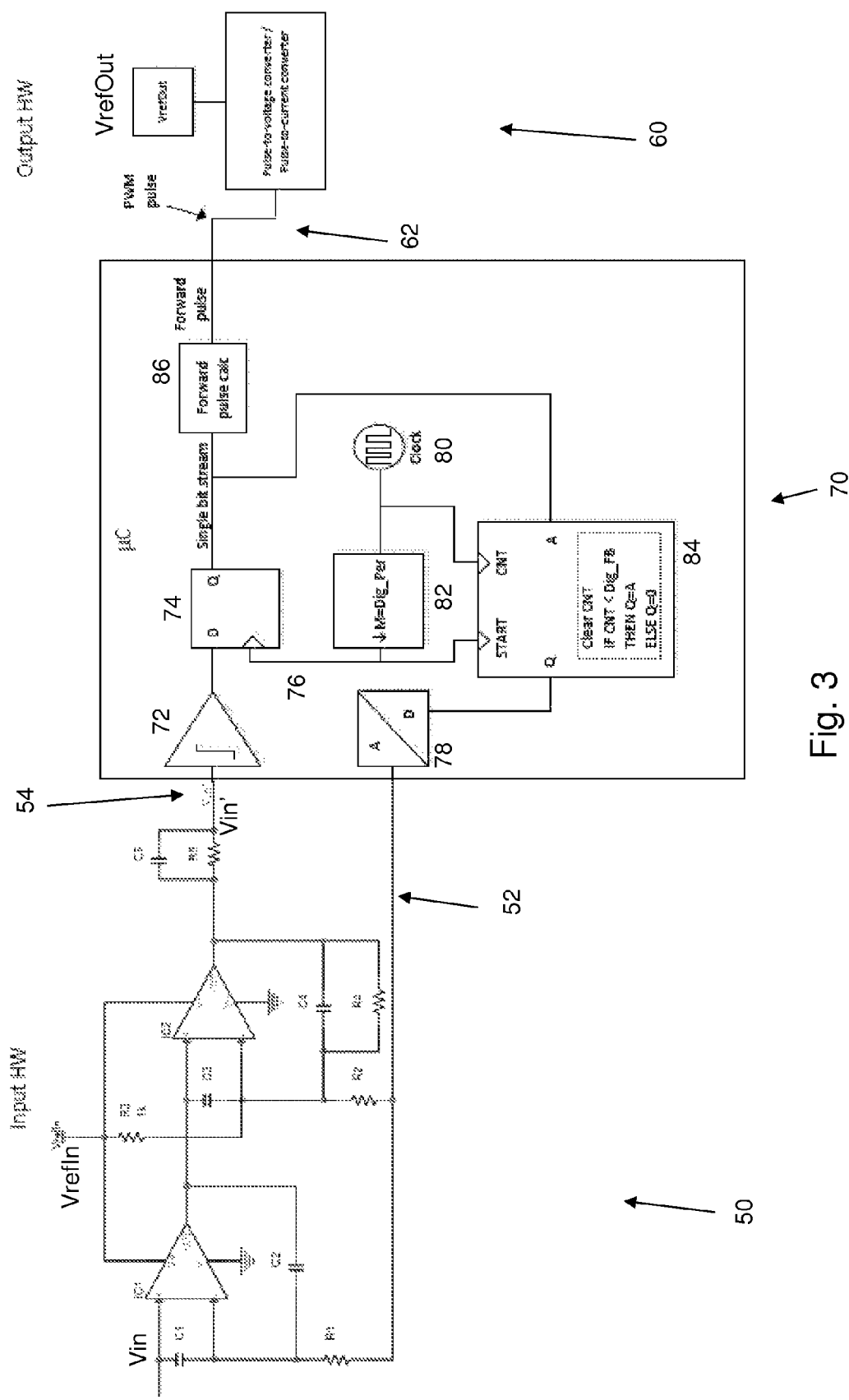
FIG. 3 is a circuit diagram showing a modulation system according to the invention.

An embodiment of a Delta Sigma converter system according to an embodiment of the invention is shown in FIG. 3. The system comprises an input hardware circuit indicated at 50, an output hardware circuit indicated at 60, and a modulation system indicated at 70.

Figure 1:
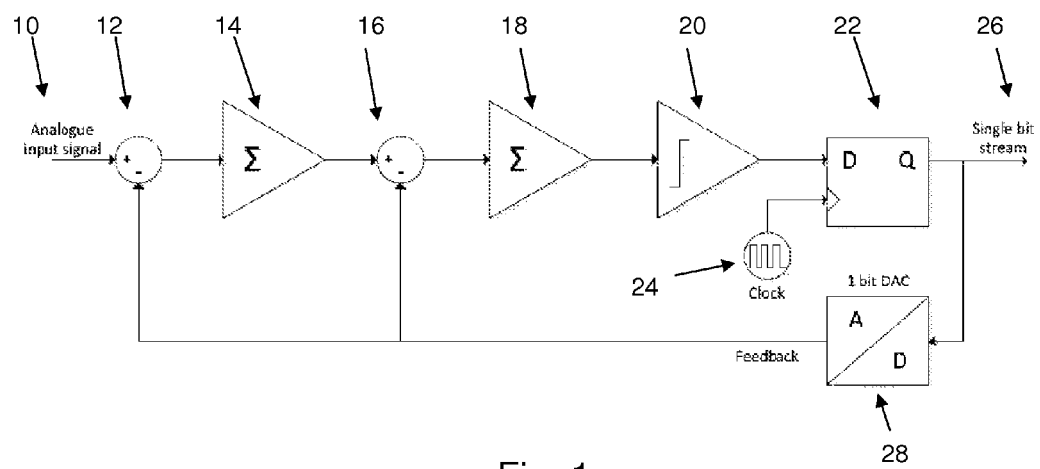
FIG. 1 is a diagram of a known second order Delta Sigma converter.
Figure 2:
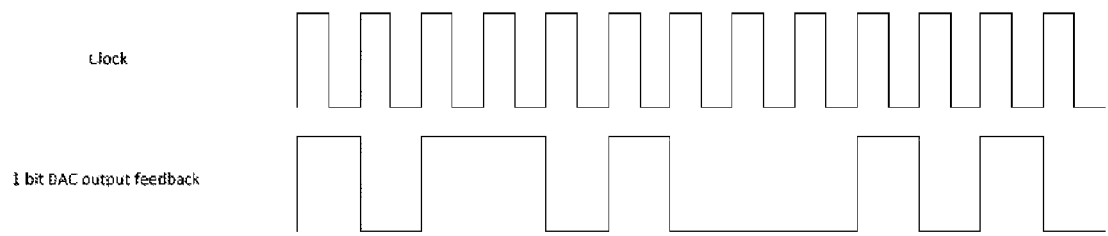
FIG. 2 is a sample signal plot for the converter of FIG. 1.

The input hardware circuit 50 comprises any suitable Delta Sigma configuration. The circuit shown in FIG. 3 comprises a second order Delta Sigma arrangement, having OpAmps IC1 and IC2 configured to receive an input signal Vin and perform two integration operations having a negative feedback signal provided at 52. The input hardware circuit 50 produces an integrated input signal Vin' at 54. The input hardware circuit 50 can be said to implement the features of the components 10,12,14,16,18 of FIG. 1. A reference voltage VrefIn is provided for the operation of the input hardware circuit 50.

The output hardware circuit 60 comprises any suitable circuitry operable to receive a modulated output signal 62 of a Delta Sigma converter, and convert a pulse signal 62 into an appropriate voltage or current based output. The pulse signal 62 can be in the form of a pulse width modulation output signal. The output hardware circuit comprises a reference voltage VrefOut.

VrefIn and VrefOut are the reference voltages in the input and output HW circuit, and may be specified by an operator to set the voltage level at which the Delta Sigma converter operates at. For example, both reference voltages may be set at 5 volts if standardised operation for the entire circuit is preferred, similarly different reference voltages may be set at the input and output circuits depending on system requirements.

The modulation system 70 comprises a comparator 72 (for example a simple 1-bit ADC) which is operable to receive said integrated input signal Vin' 54 and provide a output in the form of a High or Low signal. A latch 74 samples said High or Low signal, the latch 74 triggered by a first clock signal 76. The output of the latch 74 is provided as a single bit stream. The modulator further comprises a DAC 78 for generating a feedback signal to be output as the negative feedback 52 for the input hardware circuit 50.

A system clock 80 is provided in the modulation system 70. The system clock 80 is downsampled 82 to provide said first clock signal 76. The downsampling 82 is performed such that the first clock signal 76 is downsampled by a ratio equal to a constant Dig_Per.

The feedback signal is generated using a second latch 84, the input to the latch being the single bit stream out put by the latch 74, the second latch 84 triggered by the system clock 80. The second latch 84 is started or initialised by the first clock signal 76. On initialisation, the second latch 84 performs the following operation:
Clear CNT
IF CNT<Dig_FB
THEN Q=A
ELSE Q=0

Dig_FB is a constant defining the desired length of the feedback pulse to be generated.

In one embodiment, the Dig_Per equals 63 clock cycles and Dig_FB equals 14 clock cycles. This allows for a feedback pulse that is lower than one digital period, which is the case in an ordinary Delta Sigma modulator.

The value 63 comes from the following:
Tosc=4*1/Fosc=4/(8*10^6)=500 nanoseconds, where Fosc is the oscillator frequency for a microprocessor used as the modulation system 70 in the embodiment and the instruction clock 4 times 1/Fosc (microchip PIC specific).

Specifying a sample frequency ~32 kHz, which gives 1/32000/500 nanoseconds=62.5 instruction clocks~63 (=Dig_Per).

The values for the digital feedback is chosen from the input/output relationships that the system shall handle. In this case, a Dig_FB is set at 14, to provide stable constants for feed forward conditioning (described below). It will be understood that other values may be selected for the constants.

The modulation system 70 further comprises a forward pulse calculation module 86, operable to perform signal conditioning on the sampled comparator output. The forward pulse calculation module 86 is operable to generate a modulated output signal 62 to be received by the output hardware circuit 60. The forward pulse calculation module 86 comprises an accumulator module (not shown), preferably operable to perform 24 bit accumulation.

Figure 4:
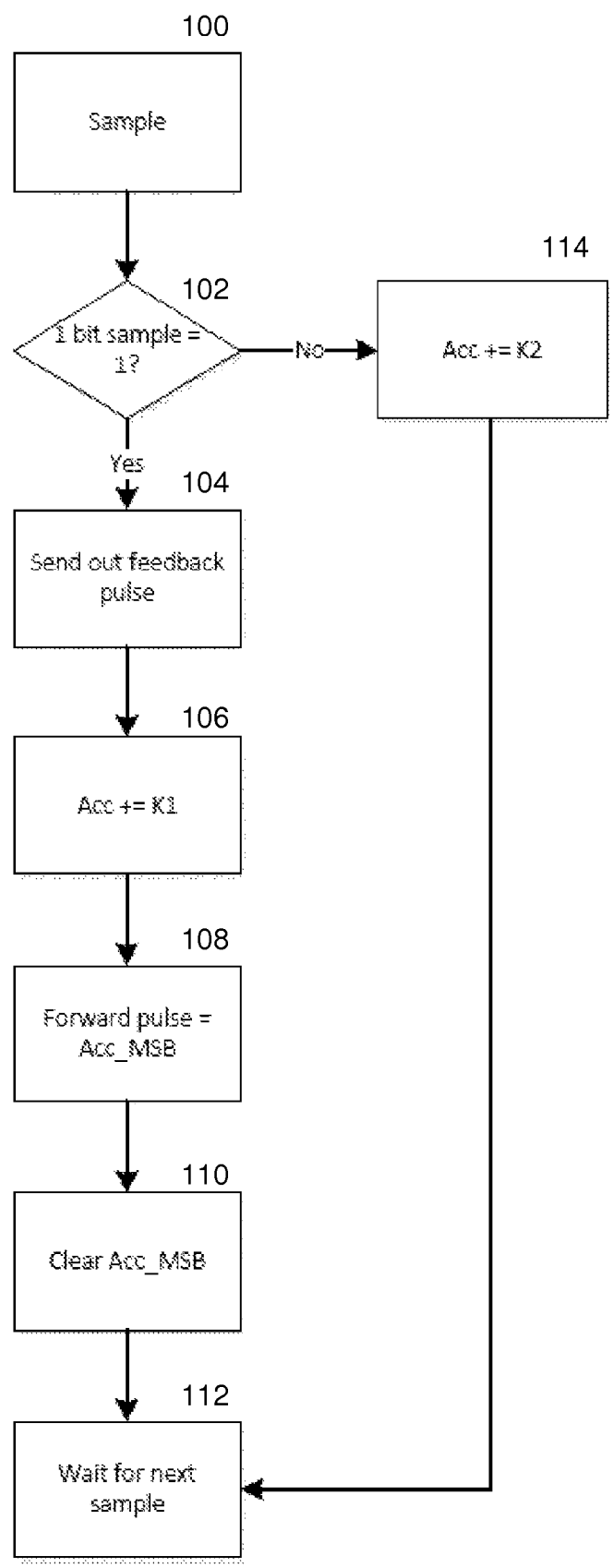
FIG. 4 shows a process diagram for a modulation method according to the invention.

With reference to FIG. 4, the forward pulse calculation module 86 implements the following steps of a method. At step 100, a sample is taken by the latch 74 based on the first clock signal 76. The forward pulse calculation module 86 detects (step 102) if the sample is a '1' or a '0'.

If '1', a feedback pulse will be generated (step 104) at the second latch 84 (as described above). In the forward pulse calculation module 86, a first constant K1 will be added in the accumulator (step 106). The modulated output signal 62 (also called forward pulse) is produced (step 108) by the forward pulse calculation module 86, in this embodiment by the most significant byte (MSB) of the accumulator. The MSB of the accumulator is then cleared or reset (step 110), and the forward pulse calculation module 86 waits for the next sample from the latch 74 (step 112).

If 'a sample of '0' is detected, a second constant K2 is added in the accumulator (step 114), and the forward pulse calculation module 86 waits for the next sample (step 112). (It will be understood that what is not shown for a sample of '0' is that the second latch 84 also initialises another feedback pulse generation cycle—as it is started by the first clock signal 76—but as the sample is '0' no actual pulse will be sent as feedback—i.e. feedback of '0').

Figure 5:
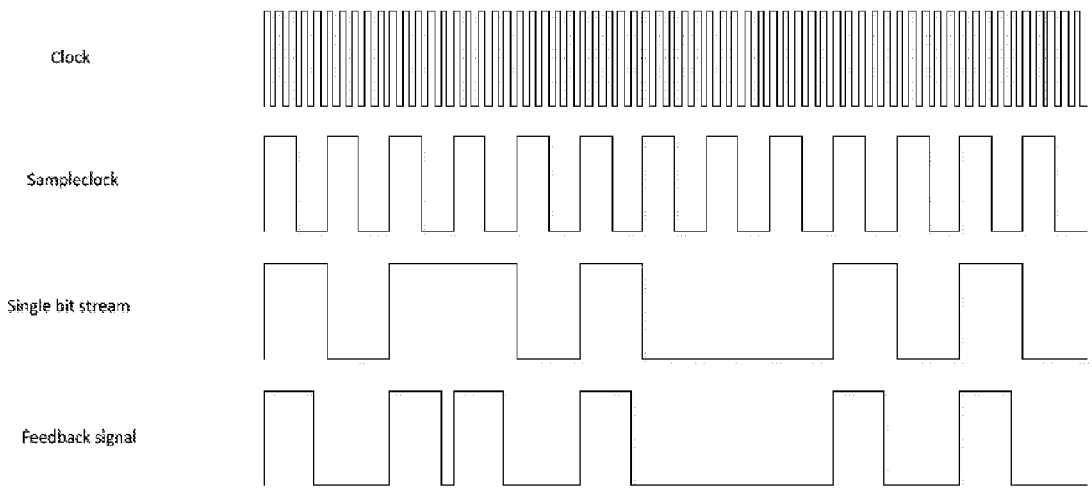
FIG. 5 is a sample timing diagram for the system of FIG. 3

The sequence may be described as the following:
Perform 1 bit sample
IF sample=1
THEN Send out Feedback pulse
   Acc+=K1 (24 precision add)
   ForwardPulse=AccMSB
   Clear AccMSB
ELSE
   Acc+=K2 (24 precision add)
Wait for next SampleClock A sample bit stream for the modulation system 70 is shown at FIG. 5, where 'Clock' is the system clock 80; 'Sampleclock' is the first clock signal 76; the 'Single bit stream' is the sampled output of the comparator after the latch 74; and 'Feedback signal' is the negative feedback 52 output by the modulation system 70.

The timing of the system can be seen in FIG. 5 where the sampleclock is downsampled from the clock and the feedback signal does not have the same pulsewidth as the bits in the single bit stream (i.e. the length of sampleclock).

Figure 6:
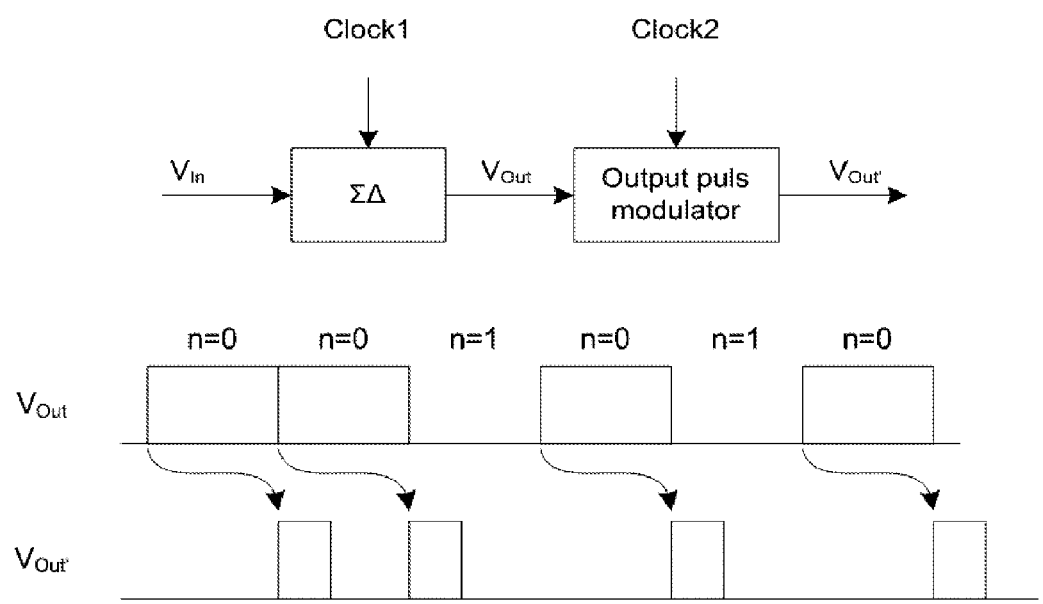
FIG. 6 is an illustrative diagram for the operation and timing of the system of the invention.

FIG. 6 aims to describe a general view of the system, which shows the relationship between the bitstream produced by the Delta Sigma system, and the forward pulse provided to the output hardware circuit 60.

n donates the number of '0' in the sampled bitstream, i.e. it counts the '0' between each '1'. The aim is to send out a forward pulse when a '1' is sampled, meaning that there is a 1:1 relationship between the sampled bitstream and the forward pulse (Vout' in FIG. 6).

The delay can be used in the overall formula to adjust constants K1 and K2 to fit a given need in a given input/output relationship.

The input/output relationship formula can be shown as follows:

$$V_{Out} = V_{In} = V_{ref} \cdot \left(\frac{1}{n+1}\right)$$

Accordingly, $$V_{Out'} = V_{ref} \cdot \left(\frac{k_1 + k_2 \cdot n}{n+1} + k_3\right)$$

$$\Downarrow$$

$$V_{Out'} = V_{ref} \cdot \left(\frac{k_1}{n+1} + \frac{k_2 \cdot n}{n+1} + k_3\right)$$

$$\Downarrow$$

$$V_{Out'} = V_{ref} \cdot \left(\frac{k_1}{n+1} + k_2 - \frac{k_2}{n+1} + k_3\right)$$

$$\Downarrow$$

$$V_{Out'} = V_{ref} \cdot \left(\frac{k_1 - k_2}{n+1} + k_2 + k_3\right)$$

$$\Downarrow$$

$$V_{Out'} = \frac{V_{ref}}{n+1} \cdot (k_1 - k_2) + V_{ref} \cdot (k_2 + k_3)$$

$$\Downarrow$$

$$V_{Out'} = V_{In} \cdot (k_1 - k_2) + V_{ref} \cdot (k_2 + k_3) = V_{In} \cdot \alpha + \beta$$

It will be understood that the modulation may be configured to generate a small output pulse when the sampled bit value is '0'—this is the static offset is desired in the system. This pulse acts to keep a high frequency in the forward output signal (which can be filtered out). Such a pulse is dependent on the constant K3 above. In the present embodiment, K3 is set at '0'.

A preferred embodiment provides for the constants, K1 and K2, used for the linear transformation to be defined as follows:

$$K1 = \frac{\text{Dig\_Per}}{\text{VrefOut}} \cdot \left(Vout_{0\%} \cdot \frac{1-m_2}{m_1-m_2} - Vout_{100\%} \cdot \frac{1-m_1}{m_1-m_2}\right)$$

$$K2 = \frac{\text{Dig\_Per}}{\text{VrefOut}} \cdot \left(Vout_{100\%} \cdot \frac{m_1}{m_1-m_2} - Vout_{0\%} \cdot \frac{m_2}{m_1-m_2}\right)$$

$$m_1 = \frac{Vin_{0\%}}{\text{VrefIn}} \cdot \frac{\text{Dig\_Per}}{\text{Dig\_FB}}$$

$$m_2 = \frac{Vin_{100\%}}{\text{VrefIn}} \cdot \frac{\text{Dig\_Per}}{\text{Dig\_FB}}$$

where Dig_Per is the period of the first clock signal 76, Dig_FB is the duration of one period of the modulated feedback signal, Vin0% and Vin100% are respectively the low and high input voltages to the input hardware circuit 50, Vout0% and Vout100% are respectively the low and high output voltages of the output hardware circuit, VrefIn is the input reference voltage, and VrefOut is the output reference voltage.

Figure 7:
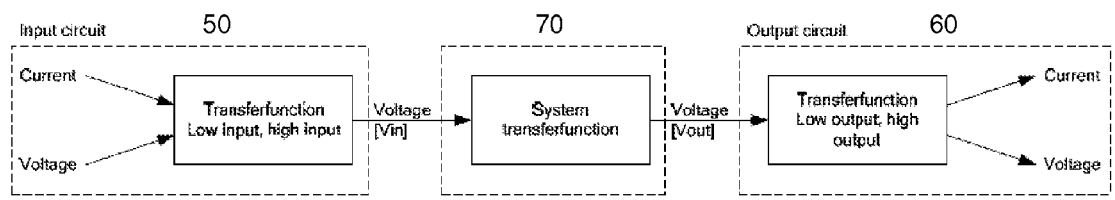
FIG. 7 is an illustrative diagram of the functional blocks of the system of the invention.

The modulation system 70 can be effectively represented as in FIG. 7, wherein the modulation system 70 implements a system transfer function similar to that described above.

The input hardware circuit 50 is operable to receive an input signal which may be a current or voltage signal, perform an integration operation on the signal and forward the output to the modulation system 70, which provides a modulated output to the output hardware circuit 60, which can convert the signal into an appropriate current or voltage output signal having the required signal characteristics (e.g. high-low range, etc.).

The system is operable to adjust the transfer function (preferably the selection of constants K1 and K2) depending on the detected input signal configuration, and required output signal configuration. I.e.:

Input circuit; converts the input signal from a current or voltage to the input voltage [Vin].
System transfer function; this is the implementation of the 2'nd order sigma delta converter and the corresponding linear transformation of the sampled signal.
Output circuit; converts the output voltage from the system transfer function [Vout] to either a current or voltage.

Figure 8:
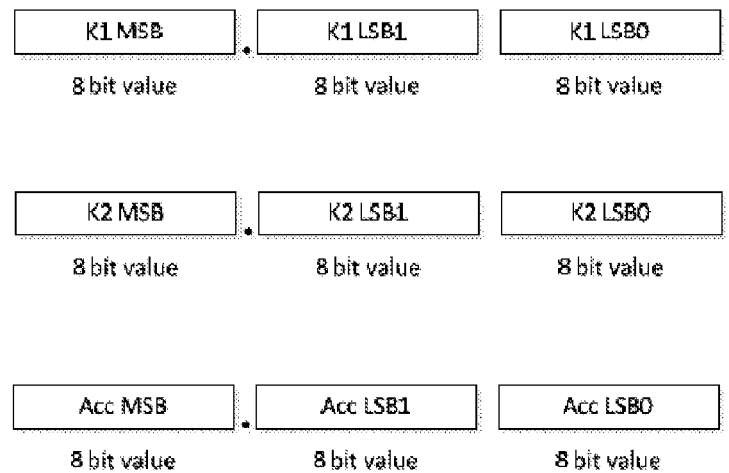
FIG. 8 is an illustration as to how constants K1 and K2 may be stored and how an accumulation module may be represented in the system of the invention.

The implementation of the transformation is preferably done by defining two constants K1 and K2. With reference to FIG. 8, these two constants are preferably defined as 24 bit values where the MSB byte defines the integer part and the two other bytes define the decimal part, but other configurations may be used as appropriate. Furthermore, the forward pulse is mathematically generated from simple additions, and the accumulated value Acc is stored in a 24 bit value as well.

The key features in the system are the following 1 bit 2'nd sigma delta modulator Digital modulated feedback pulse with minimum delay This implementation gives an easily implementable solution of a linear conversion of the input signal by modulating the feedback pulse.

Low noise due to sigma delta converter which is preferable for the following the following linear conversion.

Linear conversion of input bit stream

Forward pulse calculated from simple addition

'1' sample adds 'K1' constant (24 bit addition)

'0' sample adds 'K2' constant (24 bit addition)

These simple adds allows for positive and negative values for K1 and K2 by using two's complement math.

As described above, the actual values for K1 and K2 are defined from the given input/output relationship. Simple adds allows for implementation in a microprocessor/microcontroller (μC) without usage of multiplications, which isn't natively is available in most μCs.

By contrast, multiplication can be implemented in firmware in a μC, but it slows the process down i.e. lower sample rate. The sigma delta converter is based on oversampling thus a lowering of the oversampling rate is not preferable.

The system handles the input/output for two output channels independently, meaning that one input signal (i.e. voltage) can be converted to a current signal in first output circuit and to a voltage signal on the second output circuit. All by using two sets of different K1 and K2 values defined for the given input/output relationship.

The system allows theoretically all input/output relationships to exists, it is just a matter of precision of the used constants, K1 and K2.

One example of a transfer function of the invention is as follows:

$$V_O = (V_{In} + V_{Off\_In}) \cdot (\alpha_1 \cdot (k_1 - k_2) + \alpha_2) + V_{Mod\_Ref}(k_2 + k_3) + V_{off\_On}$$

Equation 2: System transfer function equation

The equation variables are described in the following three tables.

TABLE 4

Known variables

| Known variable | Definition |
|---|---|
| $V_{in}$ | Applied input voltage |
| $V_O$ | Measured output voltage. |

TABLE 5

Known firmware constants

| Known constants | Definition |
|---|---|
| $k_1$ | Firmware constant. |
| $k_2$ | Firmware constant. |
| $k_3$ | Firmware constant. |

TABLE 6

Unknown system constants

| Unknown constants | Definition |
|---|---|
| $V_{Off\_In}$ | An offset voltage on the input side generated from the opamp and the resistor network. |
| $\alpha_1$ | System gain introduced by the system, i.e. external resistor network. |
| $\alpha_2$ | Offset error introduced by the system. |
| $V_{Mod\_Ref}$ | The reference voltage of the modulator. This voltage is a composite voltage and is not the same as the voltage defined as Vref in the schematics. |
| $V_{Off\_Out}$ | An offset voltage on the output side generated form the opamp and resistor network. |

For this example, α1 and α2 are system specific and needs to be measured. This is done by using known K1 and K2 values, applying known input voltage, and measuring the corresponding output value. This ends up with five equations to find all unknowns. Those five equations are shown below (this is done for a voltage measurement, but the procedure is the same for a current measurement):

$$V_{Out\_low}' = (V_{In\_low} + V_{Off\_In}) \cdot (\alpha_1 \cdot (k_1' - k_2') + \alpha_2) + V_{Mod\_Ref} k_2' + V_{Off\_Out} \qquad \text{Eq 1}$$

$$V_{Out\_high}' = (V_{In\_high} + V_{Off\_In}) \cdot (\alpha_1 \cdot (k_1' - k_2') + \alpha_2) + V_{Mod\_Ref} k_2' + V_{Off\_Out} \qquad \text{Eq 2}$$

$$V_{Out\_low}'' = (V_{In\_low} + V_{Off\_In}) \cdot (\alpha_1 \cdot (k_1'' - k_2') + \alpha_2) + V_{Mod\_Ref} k_2' + V_{Off\_Out} \qquad \text{Eq 3}$$

$$V_{Out\_high}'' = (V_{In\_high} + V_{Off\_In}) \cdot (\alpha_1 \cdot (k_1'' - k_2') + \alpha_2) + V_{Mod\_Ref} k_2' + V_{Off\_Out} \qquad \text{Eq 4}$$

$$V_{Out\_high}'' = (V_{In\_high} + V_{Off\_In}) \cdot (\alpha_1 \cdot (k_1'' - k_2'') + \alpha_2) + V_{Mod\_Ref} k_2'' + V_{Off\_Out} \qquad \text{Eq 5}$$

Our five unknowns in the above are: V_Off_In, α1, α2, V_Mod_Ref, V_Off_Out.

V_In_Low and V_In_High are applied, and V_Out_Low and V_Out_High are measured.

K1 and K2 are predefined for all five measurements where K1'!=K1" and K2'!=K2".

This gives us five equations with five unknowns, which can be solved using simultaneous equations.

It will be understood that the modulation system 70 may be used with other converter configurations, and is also not limited to a single bit stream output of said converter system.

The modulation system 70 may be implemented in firmware, e.g. any suitable microprocessor, e.g. a PIC16F1936.

The invention is not limited to the embodiment described herein, and may be modified or adapted without departing from the scope of the present invention.

The invention claimed is:

1. A modulation method for a converter having an input circuit to receive an input signal and an output circuit to provide a converted output signal, the modulation method comprising the steps of:
    receiving a comparator output from an input circuit;
    sampling said comparator output based on a first clock;
    generating a forward pulse to an output circuit based on said first clock;
    generating a feedback signal for said input circuit based on a second clock, wherein said second clock has a lesser frequency than said first clock;
    wherein said step of generating a forward pulse is based on at least one system constant, and wherein said system constant is dependent on the characteristics of at least one of the input signal of said input circuit or the output signal of said output circuit.

2. The method of claim 1, wherein the method comprises the step of sending said forward pulse to said output circuit when the sampled comparator output is High.

3. The method of claim 1, wherein the method comprises the step of delaying said feedback signal is delayed relative to the sampling.

4. The method of claim 1, wherein the method comprises the step of detecting the characteristics of said input signal of said input circuit and said output signal of said output circuit.

5. A modulation method for a converter having an input circuit to receive an input signal and an output circuit to provide a converted output signal, the modulation method comprising the steps of:
receiving a comparator output from an input circuit;
sampling said comparator output based on a first clock;
generating a forward pulse to an output circuit based on said first clock;
generating a feedback signal for said input circuit based on a second clock, wherein said second clock has a lesser frequency than said first clock;
a Delta Sigma converter, the Delta Sigma converter comprising an input circuit operable to receive an input signal and provide an integrated input signal having a negative feedback loop, and an output circuit operable to receive a modulated output signal and produce a converted output signal, wherein the method comprises the steps of:
providing a comparator output of an integrated input signal of said input hardware circuit;
sampling said comparator output, said sampling based on a first clock frequency;
performing a forward conditioning operation on said sampled comparator output to provide a modulated output signal for said output circuit;
generating a modulated feedback signal based on said sampled comparator output, said generating based on a second clock frequency; and
outputting said modulated feedback signal to said input circuit,
wherein said first clock frequency is less than said second clock frequency.

6. The method of claim 5, wherein the input circuit and the output circuit are operable to provide different combinations of input signal and converted output signal formats, wherein the method comprises the step of detecting the input-output format combination of the input circuit and the output circuit, and wherein said step of performing a forward conditioning operation is based on said detected input-output format combination.

7. The method of claim 5, wherein said step of performing a forward conditioning operation comprises performing a mathematical operation on said sampled comparator output, said mathematical operation based on a set of constants, wherein the method comprises the steps of:
storing a plurality of constants in memory;
detecting the input-output format combination of the input circuit and the output circuit; and
selecting a set of constants from memory from said plurality of constants based on said detected input-output format combination;
performing said mathematical operation using said selected set of constants.

8. The method of claim 5, wherein said step of performing a forward conditioning operation comprises the steps of:
adding a constant in an accumulator, wherein said constant value is selected based on the sampled comparator output; and
generating a modulated output signal based on the output of said accumulator.

9. The method of claim 8, wherein said step of performing a forward conditioning operation comprises the steps of:
if said sampled comparator output is High,
adding a first selected constant K1 in the accumulator, and
sending a modulated output signal to said output circuit, said modulated output
signal based on the output of said accumulator; and
if said sampled comparator output is Low,
adding a second selected constant K2 in the accumulator.

10. The method of claim 9, wherein the method comprises the step of clearing the integer section of the accumulator when a modulated output signal is generated.

11. The method of claim 9, wherein the method comprises the step of providing said first selected constant K1 and said second selected constant K2, and wherein K1 and K2 are defined by the formulas:

$$K1 = \frac{\text{Dig\_Per}}{\text{VrefOut}} \cdot \left( Vout_{0\%} \cdot \frac{1-m_2}{m_1-m_2} - Vout_{100\%} \cdot \frac{1-m_1}{m_1-m_2} \right)$$

$$K2 = \frac{\text{Dig\_Per}}{\text{VrefOut}} \cdot \left( Vout_{100\%} \cdot \frac{m_1}{m_1-m_2} - Vout_{0\%} \cdot \frac{m_2}{m_1-m_2} \right)$$

$$m_1 = \frac{Vin_{0\%}}{\text{VrefIn}} \cdot \frac{\text{Dig\_Per}}{\text{Dig\_FB}}$$

$$m_2 = \frac{Vin_{100\%}}{\text{VrefIn}} \cdot \frac{\text{Dig\_Per}}{\text{Dig\_FB}}$$

where Dig_Per is the period of said first clock frequency, Dig_FB is the duration of one period of the modulated feedback signal, Vin0% is the input low voltage, Vin100% is the input high voltage, Vout0% is the output low voltage, Vout100% is the output high voltage, VrefIn is the input reference voltage, and VrefOut is the output reference voltage.

12. The method of claim 9, wherein the method comprises the step of storing constants K1 and K2 as two's complement binary numbers, and wherein said adding steps comprise a two's complement binary addition.

13. The method of claim 9, wherein said step of sending a modulated output signal to said output circuit comprises sending the integer result of the adding operation as the modulated output signal.

14. The method of claim 9, wherein said constants K1 and K2 are defined as 24 bit values, wherein 8 bits of said 24 bit values comprise the integer value of the constants, wherein said step of adding comprises a 24 bit accumulation operation, and wherein said step of sending a modulated output signal to said output circuit comprises sending 8 bits representing an integer value of the 24 bit accumulation as the modulated output signal.

15. The method of claim 5, wherein the method comprises the steps of:
providing a first clock having a first clock frequency; and
providing a system clock having a second clock frequency, wherein said first clock is provided by downsampling said system clock.

16. The method of claim 15, wherein said step of generating a modulated feedback signal comprises the steps of:
   counting the pulses of said system clock to provide a count value CNT; and
   when CNT is less than a predefined period value Dig_FB, outputting said sampled comparator output as said modulated feedback signal;
   when CNT is greater than or equal to said predefined period value Dig_FB, outputting 0 as said modulated feedback signal.

17. The method of claim 16, wherein said step of generating a modulated feedback signal comprises the step of:
   initialising said CNT value for every pulse of said first clock.

18. The method of claim 5, wherein said step of generating a modulated feedback signal comprises performing a digital to analogue signal conversion of said modulated feedback signal.

19. The method of claim 5, wherein said step of providing a comparator output comprises the step of comparing an integrated output of said input hardware circuit with a threshold value.

20. A signal converter comprising:
   an input circuit operable to receive an input signal and provide an integrated input signal having a negative feedback loop;
   an output circuit operable to receive a modulated output signal and produce a converted output signal; and
   a controller operable to receive said integrated input signal and output a modulated feedback signal to said input circuit and a modulated output signal to said output circuit, wherein the controller is operable to implement a modulation method for a converter having an input circuit to receive an input signal and an output circuit to provide a converted output signal, the modulation method comprising the steps of:
   receiving a comparator output from an input circuit;
   sampling said comparator output based on a first clock;
   generating a forward pulse to an output circuit based on said first clock;
   generating a feedback signal for said input circuit based on a second clock, wherein said second clock has a lesser frequency than said first clock.

* * * * *